United States Patent
Tsai et al.

(10) Patent No.: US 6,680,258 B1
(45) Date of Patent: Jan. 20, 2004

(54) METHOD OF FORMING AN OPENING THROUGH AN INSULATING LAYER OF A SEMICONDUCTOR DEVICE

(75) Inventors: Yuan-Li Tsai, Taipei (TW); Yu-Piao Wang, Jubei (TW)

(73) Assignee: ProMOS Technologies, Inc. (TW)

( * ) Notice: Subject to any disclaimer, the term of this patent is extended or adjusted under 35 U.S.C. 154(b) by 0 days.

(21) Appl. No.: 10/261,947

(22) Filed: Oct. 2, 2002

(51) Int. Cl.$^7$ .................. H01L 21/302; H01L 21/461
(52) U.S. Cl. .................. 438/706; 438/711; 438/723; 438/724; 438/743; 438/744
(58) Field of Search .................. 438/257, 706, 438/711, 723, 724, 743, 744, 637, 666, 672, 700, 639, 586, 595

(56) References Cited

U.S. PATENT DOCUMENTS

| | | | |
|---|---|---|---|
| 5,468,342 A | 11/1995 | Nulty et al. | |
| 5,702,981 A | 12/1997 | Maniar et al. | |
| 5,741,741 A | * 4/1998 | Tseng | 438/637 |
| 5,801,095 A | 9/1998 | Huang et al. | |
| 6,001,734 A | 12/1999 | Dryman | |
| 6,025,273 A | 2/2000 | Chen et al. | |
| 6,037,211 A | * 3/2000 | Jeng et al. | 438/253 |
| 6,143,653 A | 11/2000 | Tsai et al. | |
| 6,146,987 A | 11/2000 | Wang et al. | |
| 6,184,159 B1 | 2/2001 | Lou et al. | |
| 6,297,162 B1 | * 10/2001 | Jang et al. | 438/706 |
| 6,362,109 B1 | 3/2002 | Kim et al. | |
| 6,534,388 B1 | * 3/2003 | Lin et al. | 438/510 |

* cited by examiner

Primary Examiner—Amir Zarabian
Assistant Examiner—Khanh Duong
(74) Attorney, Agent, or Firm—Finnegan, Henderson, Farabow, Garrett & Dunner, L.L.P.

(57) ABSTRACT

An opening through an insulating layer between a first layer and a second layer of a semiconductor device is formed where the second layer is a polysilicon or amorphous silicon hard mask layer. The polysilicon or amorphous silicon hard mask layer is etched to form at least one opening through the polysilicon or amorphous silicon hard mask layer using a patterning layer as a mask having at least one opening. The insulating layer is etched to form the opening through the insulating layer using the etched polysilicon or amorphous silicon hard mask layer as a mask. The etched polysilicon or amorphous silicon hard mask layer is nitridized prior to subsequent processing.

20 Claims, 12 Drawing Sheets

METHOD OF FORMING AN OPENING THROUGH AN INSULATING LAYER OF A SEMICONDUCTOR DEVICE

FIELD OF THE INVENTION

The present invention relates generally to a method of forming an opening through an insulating layer of a semiconductor device.

BACKGROUND OF THE INVENTION

The current trend in the semiconductor industry is to make contact openings through insulating layers in semiconductor devices as small as possible to reduce the total size of the semiconductor devices. However, a smaller contact opening increases the aspect ratio of the contact. Conventional photoresist does not have enough selectivity for etching an insulating layer with an increased aspect ratio. Therefore a polysilicon or amorphous silicon hard mask, which has larger selectivity, is used in lieu of a photoresist mask to etch openings in the insulating layers. However, if the polysilicon or amorphous silicon hard mask layer is not thoroughly removed from a semiconductor device prior to filling a contact opening, a titanium silicide layer may form on the semiconductor device during the following titanium/titanium nitride (Ti/TiN) deposition or anneal process. The titanium silicide layer is hard to remove by tungsten chemical mechanical process (CMP) or tungsten etch back, and the remaining titanium silicide will cause a circuit short in the semiconductor device, thereby degrading its performance.

Accordingly, there is a need for an improved method of forming a contact opening in an insulating layer using a polysilicon or amorphous silicon hard mask layer.

SUMMARY OF THE INVENTION

In accordance with the invention, there is provided a method of forming at least one opening through an insulating layer of a semiconductor device, wherein the insulating layer is between a first layer and a second layer. The method comprises forming the insulating layer on the first layer; forming a polysilicon or amorphous silicon hard mask layer as the second layer; forming a patterning layer having at least one opening; etching the polysilicon or amorphous silicon hard mask layer using the patterning layer as a mask to form at least one opening through the polysilicon or amorphous silicon hard mask layer; etching the insulating layer using the etched polysilicon or amorphous silicon hard mask layer as a mask to form the at least one opening through the insulating layer; and nitridizing the etched polysilicon or amorphous silicon hard mask layer.

Advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
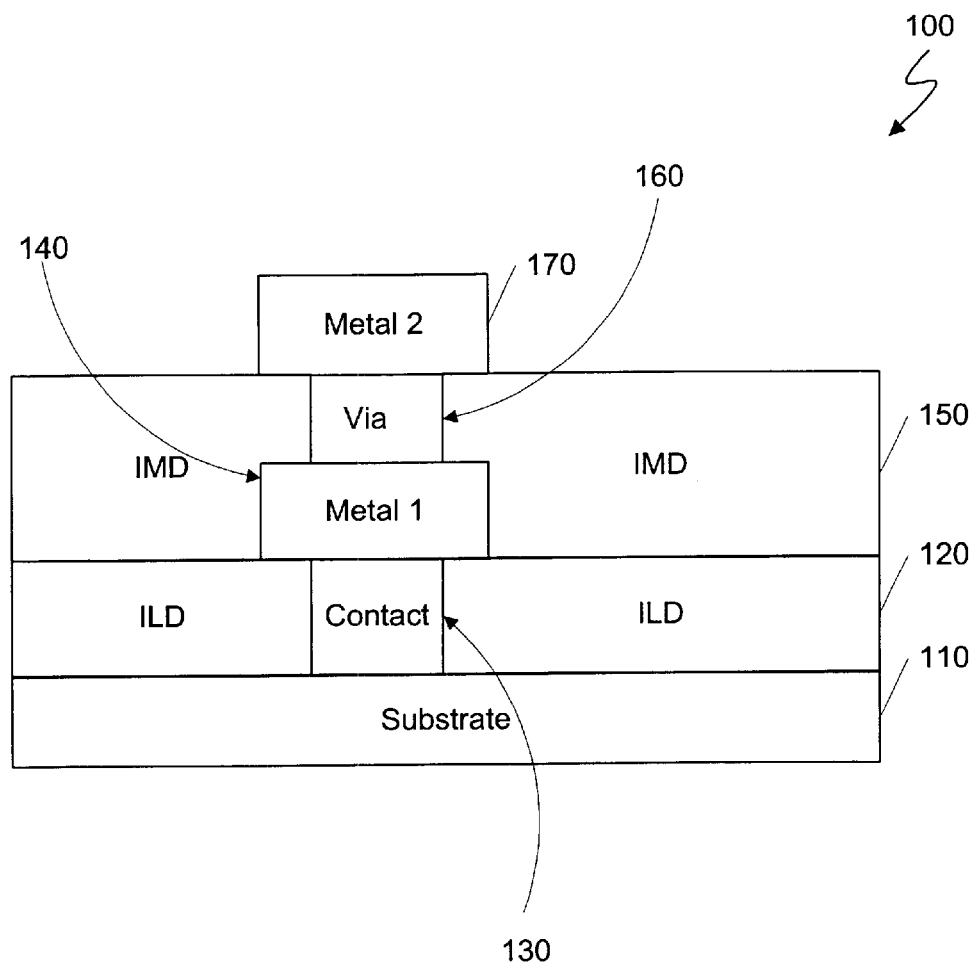
FIG. 1 illustrates a generic semiconductor device.

FIG. 1 illustrates a generic semiconductor device 100, which helps explain terms used in the present disclosure. Semiconductor device 100 comprises a substrate 110, an inter-level dielectric (ILD) layer 120, a contact 130, a lower metal line 140, an inter-metal dielectric (IMD) layer 150, a via 160, and an upper metal line 170.

Substrate 110 may be a semiconductor wafer, an active or passive device formed within the semiconductor wafer, layers formed on the surface of the semiconductor wafer, or any other supporting material upon or within which an integrated circuit (IC) is fabricated or to which an IC is attached.

ILD layer 120 is a layer of dielectric material (i.e., an insulator) used to separate substrate 110 and lower metal line 140. Contact 130 represents an interconnect that connects substrate 110 and lower metal line 140.

IMD layer 150 is a layer of dielectric material used to separate lower metal line 140 and upper metal line 170. Via 160 represents an interconnect that connects lower metal line 140 and upper metal line 170.

Embodiments consistent with the present invention can be practiced for any layer of a semiconductor device and the term "insulator layer" is used herein to refer to either ILD layer 120, IMD layer 150, or any other layer of a semiconductor device that includes an interconnect. Further, embodiments consistent with the present invention do not distinguish between contact 130 or via 160. Accordingly, the term "contact" is used to refer to either contact 130, via 160, or any other interconnect and the term "opening" or "contact opening" is used to refer to either an opening for contact 130, via 160, or any other interconnect, unless stated otherwise.

Figure 2:
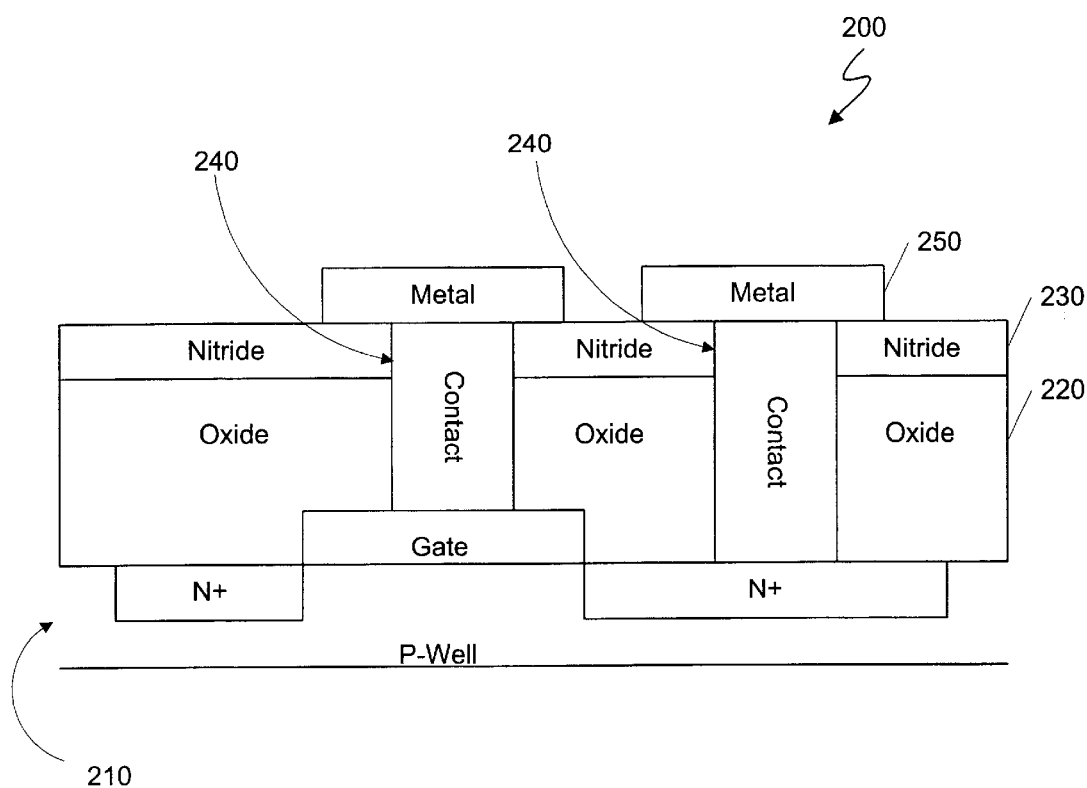
FIG. 2 generally illustrates an exemplary cross-sectional view of a conventional semiconductor device used for advanced devices such has flash memories, CMOS image sensors, or liquid crystal on silicon (LCOS) devices.

FIG. 2 generally illustrates an exemplary cross-sectional view of a conventional semiconductor device 200 used for advanced devices such as flash memories, CMOS image sensors, or liquid crystal on silicon (LCOS) devices. Semiconductor device 200 comprises a semiconductor substrate 210 having a MOS structure, an oxide layer 220, a nitride layer 230, contacts 240, and metal lines 250. The oxide/nitride structure 220, 230 may be used as an ILD layer to improve data retention rate and/or leakage current of the semiconductor device 200.

A method of forming semiconductor device 200 may comprise forming oxide layer 220 on semiconductor substrate 210 and then performing a chemical mechanical process (CMP) to planarize oxide layer 220. Once oxide layer 220 is planarized, nitride layer 230 is formed on oxide layer 220. A photoresist layer is deposited on nitride layer 230 and patterned to form openings corresponding to contact openings 240 to be formed in oxide/nitride structure 220, 230. Using the photoresist layer as a protective mask, contact openings 240 are formed by etching oxide/nitride structure 220, 230. The photoresist layer is removed and contact openings 240 are subsequently filled with a conducting material. Metal lines 250 are formed on contacts 240 thereby electrically connecting metal lines 250 and semiconductor substrate 210.

As discussed in the Background of the Invention, the current trend is to use a polysilicon or amorphous silicon hard mask in lieu of a photoresist mask to etch smaller openings in insulating layers. FIGS. 3A–D generally illustrate an exemplary method for manufacturing a semiconductor device using a polysilicon or amorphous silicon hard mask in lieu of a photoresist mask to etch an opening in an insulating layer. FIG. 4 illustrates the problem with using a polysilicon or amorphous silicon hard mask to etch an opening in an insulating layer.

Figure 3A:
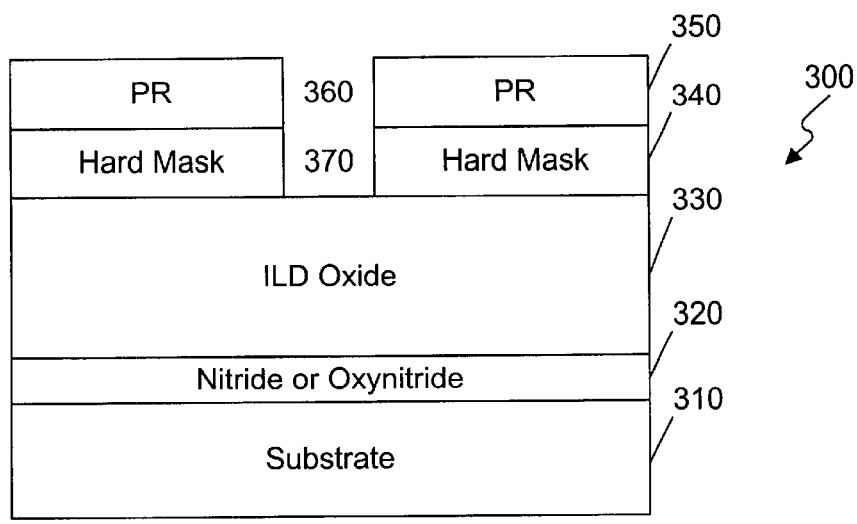
FIGS. 3A–D generally illustrate an exemplary method of manufacturing a semiconductor device using a polysilicon or amorphous silicon hard mask in lieu of a photoresist mask to etch an insulating layer.
Figure 4:
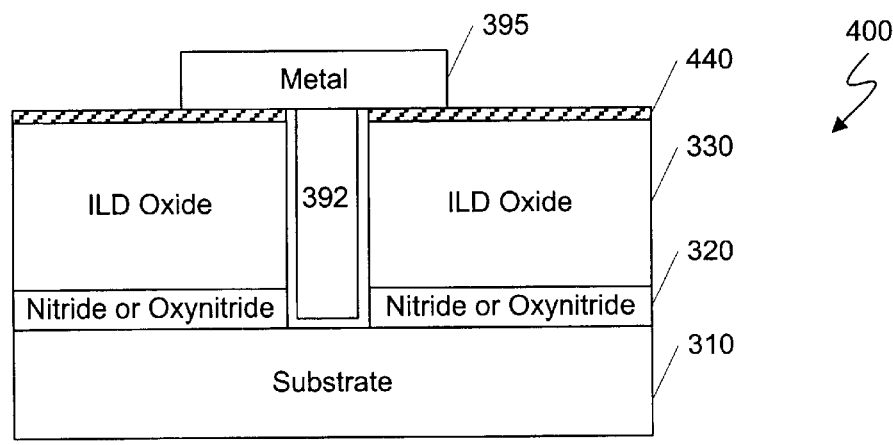
FIG. 4 illustrates a semiconductor device having a TiSi$_x$ layer.

Referring to FIG. 3A, a nitride or oxynitride layer 320 may be formed on a substrate 310. An ILD oxide layer 330 is then formed on layer 320 and a polysilicon or amorphous silicon hard mask layer 340 is formed on ILD oxide layer 330. A photoresist layer 350 is formed on polysilicon or amorphous silicon hard mask layer 340. An opening 360 is formed in photoresist layer 350 using photolithography. Opening 360 corresponds to a contact opening 380 to be formed in ILD oxide layer 330. Using photoresist layer 350 as a mask, an opening 370 is etched in polysilicon or amorphous silicon hard mask layer 340. Photoresist layer 350 is then removed.

Figure 3B:
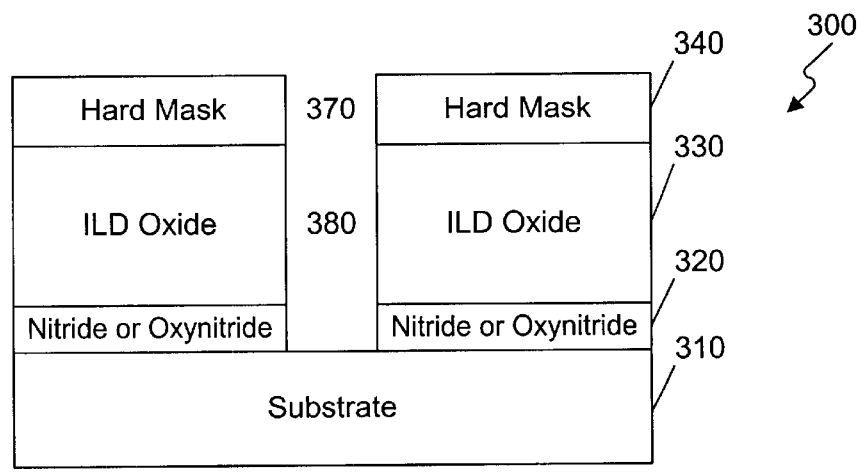

Referring to FIG. 3B, etched polysilicon or amorphous silicon hard mask layer 340 is then used as a mask to etch contact opening 380 in ILD oxide layer 330 and layer 320. Ideally, etched polysilicon or amorphous silicon hard mask layer 340 is then completely removed.

Figure 3C:
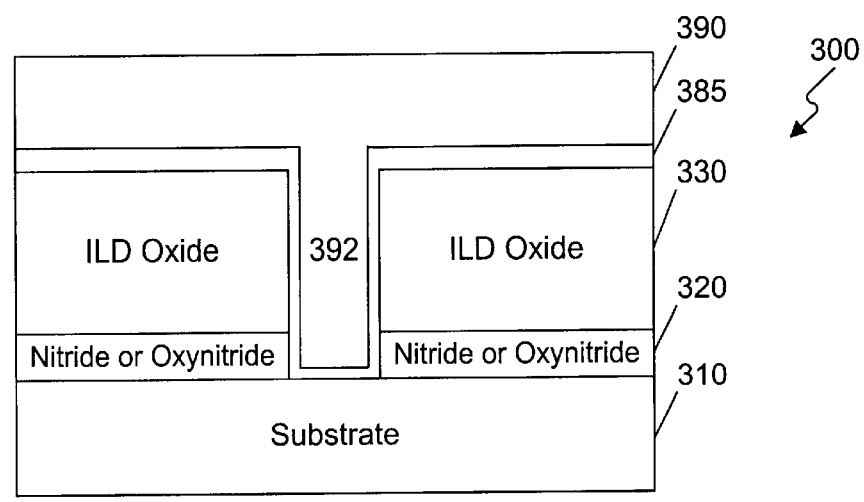

As shown in FIG. 3C, after etched polysilicon or amorphous silicon hard mask layer 340 is removed, a titanium/titanium nitride (Ti/TiN) layer 385 may be deposited on ILD oxide layer 330, the walls of contact opening 380, and the top of substrate 310 within contact opening 380. A tungsten layer 390 is then deposited into contact opening 380 and on top of Ti/TiN layer 385. Tungsten layer 390 and Ti/TiN layer 385 are then removed from the top of ILD oxide layer 330 by CMP or an etch back process, leaving a contact 392 formed within contact opening 380.

Figure 3D:
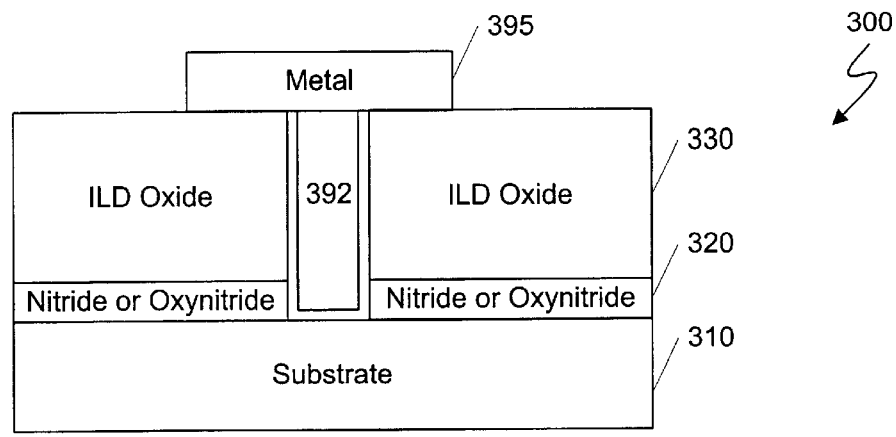

Referring to FIG. 3D, after tungsten layer 390 and Ti/TiN layer 385 are removed. A metal line 395 is formed on contact 392 thereby electrically connecting metal line 395 and substrate 310.

Turning back to FIG. 3B, if polysilicon or amorphous silicon hard mask layer 340 is not thoroughly removed after contact opening 380 is etched in ILD oxide layer 330, the polysilicon or amorphous silicon remaining on ILD oxide layer 330 may become titanium silicide $TiSi_x$ in the following Ti/TiN deposition or anneal process. The $TiSi_x$ layer is difficult to remove by CMP or an etch back process. As a result, as shown in FIG. 4, a semiconductor device 400 including a $TiSi_x$ layer 440 is formed, which causes leakage current.

Figure 5:
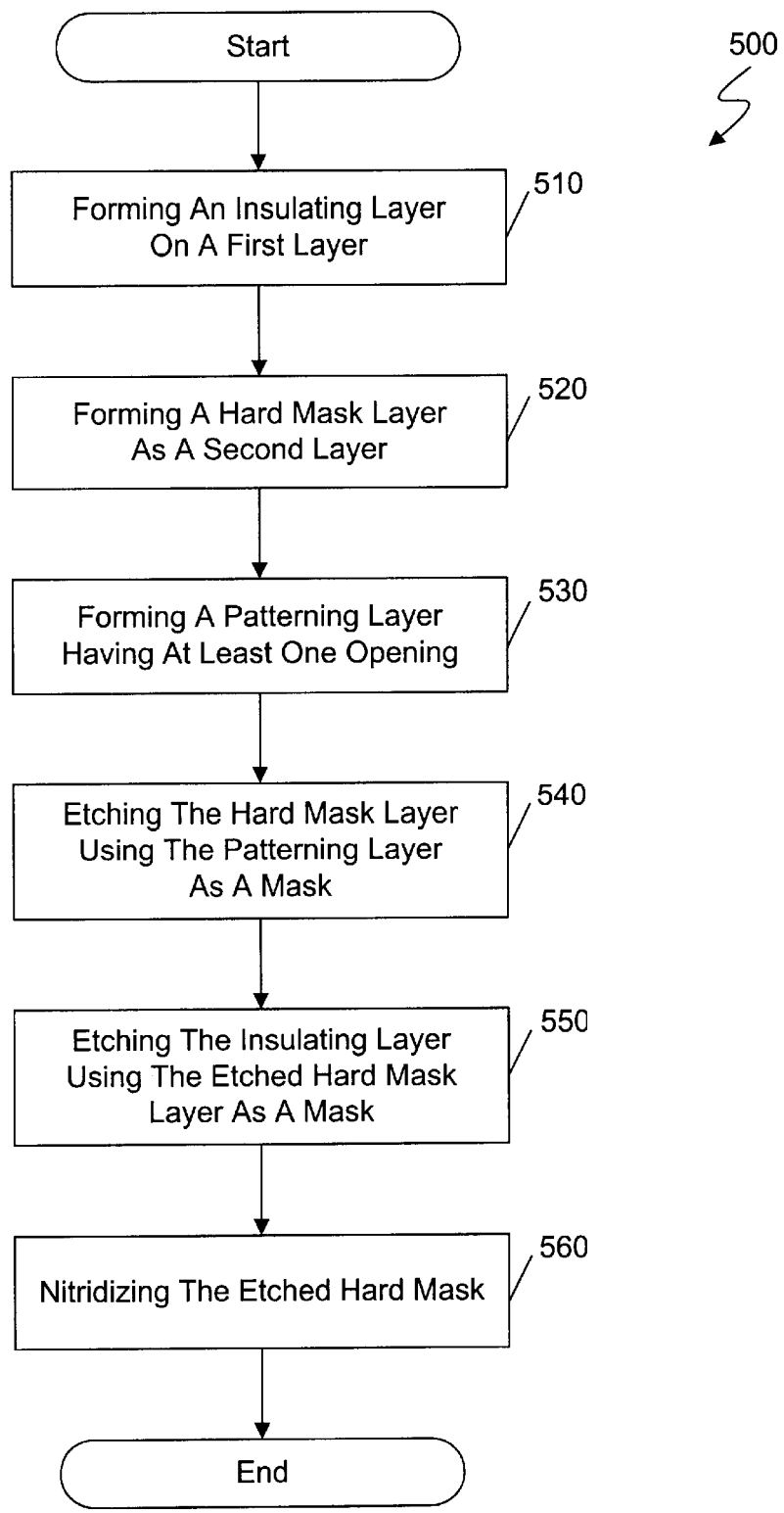
FIGS. 5–8H illustrate a method consistent with the present invention for forming an opening through an insulating layer of a semiconductor device.

Methods consistent with the present invention overcome the above described problem related to formation of $TiSi_x$. FIGS. 5–8H illustrate a method consistent with the present invention for forming an opening through an insulating layer of a semiconductor device. FIG. 5 is a flowchart for explaining stages of the method, while FIGS. 6A–6G, 7A–7G, and 8A–8H illustrate, without limitation, practice of the method on three different exemplary semiconductor device structures.

Figure 6A:
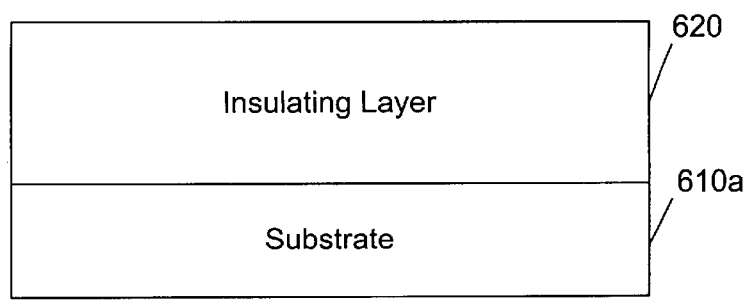
Figure 7A:
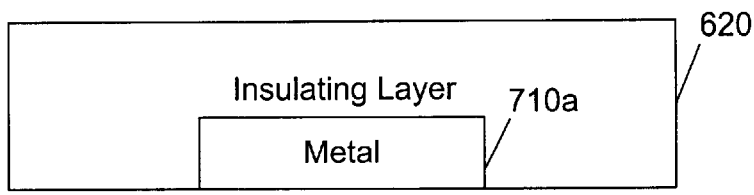
Figure 8A:
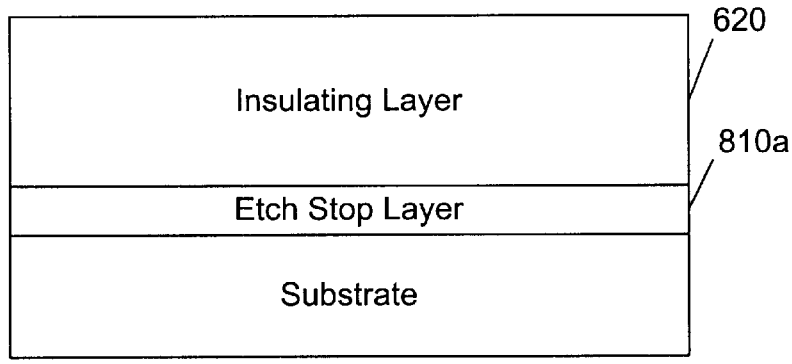

At stage 510, an insulating layer 620 is formed on a first layer 610a, 710a, 810a, as shown in FIGS. 6A, 7A, and 8A, respectively.

The first layer may be a substrate 610a, a metal layer 710a, an etch stop layer 810a, or any other layer. Etch stop layer 810a may be a silicon nitride ($Si_xN_y$) layer or a silicon oxynitride ($Si_xO_yN_z$) layer, for example.

Insulating layer 620 may be an ILD layer, IMD layer, or any other layer of a semiconductor device that includes an interconnect. Insulating layer 620 may be an oxide such as borophosphosilicate glass (BPSG), tetraethylorthosilicate (TEOS) oxide, silicon dioxide ($SiO_2$), spin-on-glass (SOG), any other type of dielectric oxide, nitride, or other dielectric material, or a combination of the foregoing. Insulating layer 620 may comprise multiple layers of different dielectric materials. Insulating layer 620 may be grown or deposited by any appropriate deposition technique. These deposition techniques are known to those of ordinary skill in the art. Examples of deposition techniques include chemical vapor deposition (CVD) and sputter deposition.

Figure 6B:
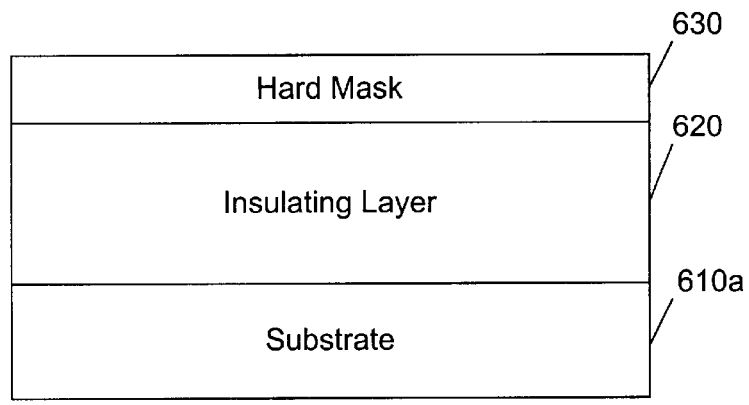
Figure 7B:
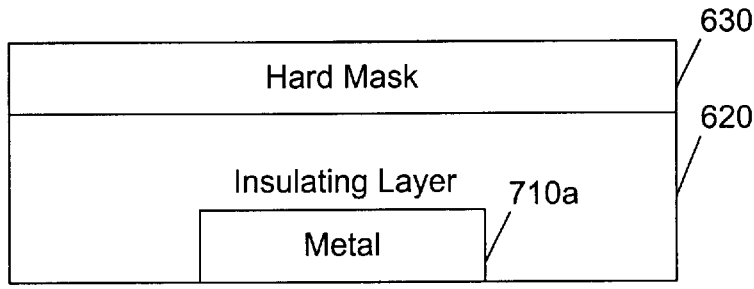
Figure 8B:
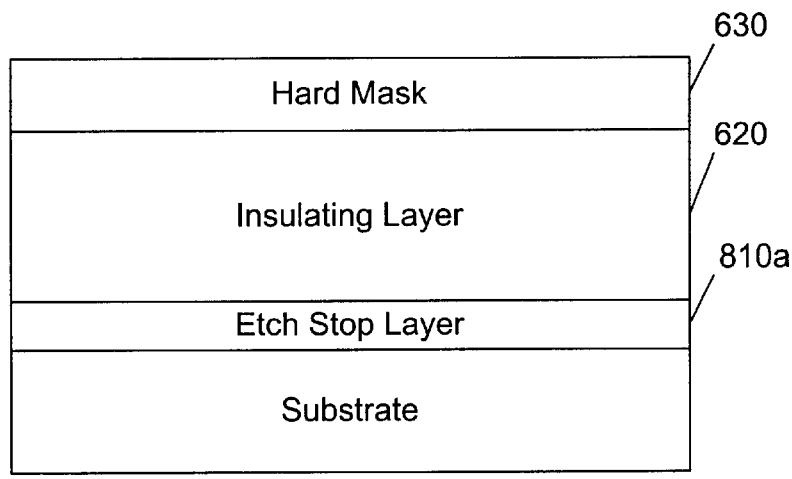

At stage 520, a polysilicon or amorphous silicon hard mask layer 630 is formed as a second layer. As shown in FIGS. 6B, 7B, and 8B, polysilicon or amorphous silicon hard mask layer 630 may be formed directly on the insulating layer 620. Alternatively, polysilicon or amorphous silicon hard mask layer 630 may be formed on any layer formed on the insulating layer 620. Polysilicon or amorphous silicon hard mask layer 630 may be deposited by any appropriate deposition technique. These deposition techniques are known to those of ordinary skill in the art.

Figure 6C:
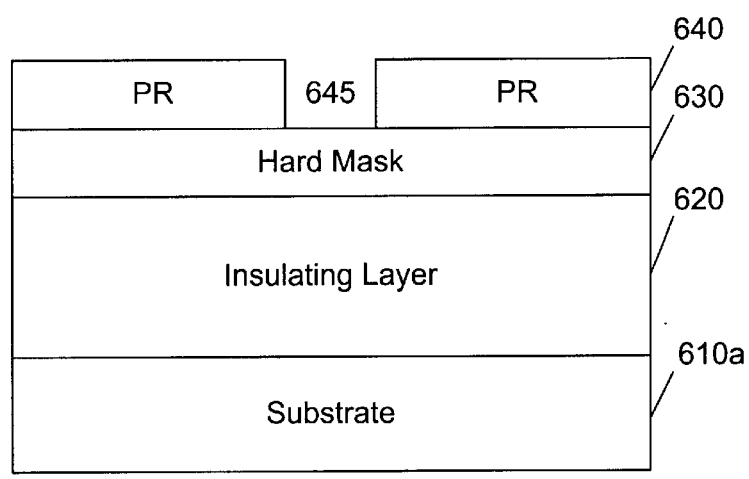
Figure 7C:
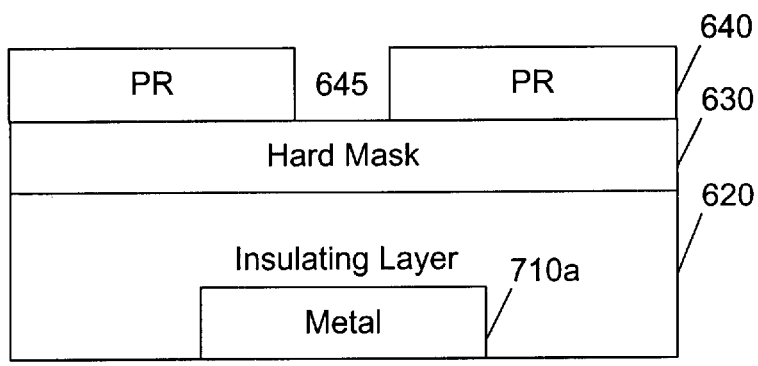
Figure 8C:
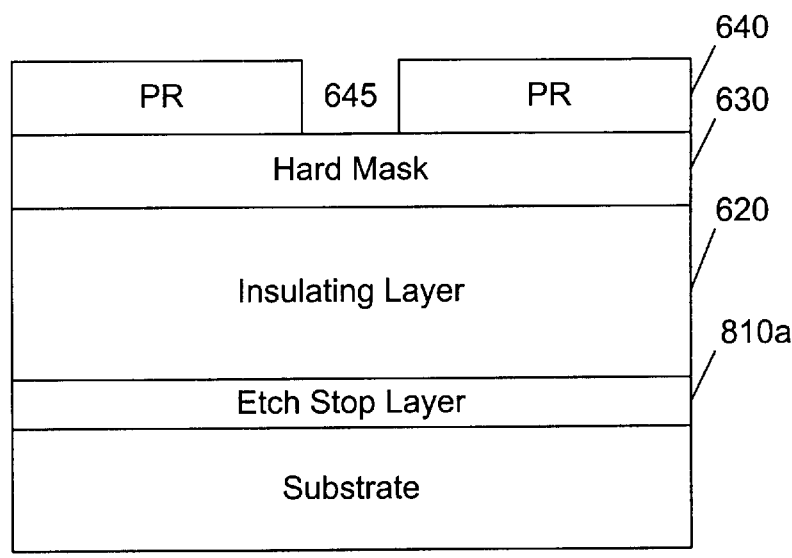

At stage 530, a patterning layer 640 having one or more openings is formed. As shown in FIGS. 6C, 7C, and 8C, patterning layer 640 may be formed directly on the polysilicon or amorphous silicon hard mask layer 630. Alternatively, patterning layer 640 may be formed on any layer formed on polysilicon or amorphous silicon hard mask layer 630. Although FIGS. 6C, 7C, and 8C illustrate a single opening 645 in patterning layer 640, multiple openings may be formed. Opening 645 correspond to a contact opening 655 to be formed in insulating layer 620. Patterning layer 640 may be photoresist or any other photo-sensitive material or mask. Opening 645 may be formed by photolithography or any other appropriate technique.

Figure 6D:
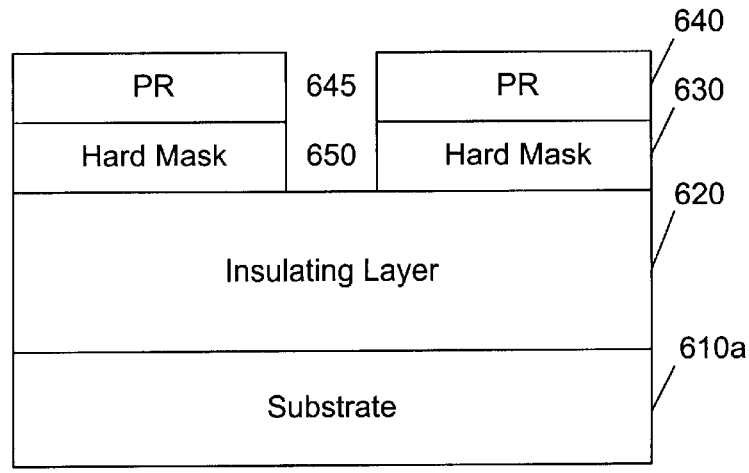
Figure 7D:
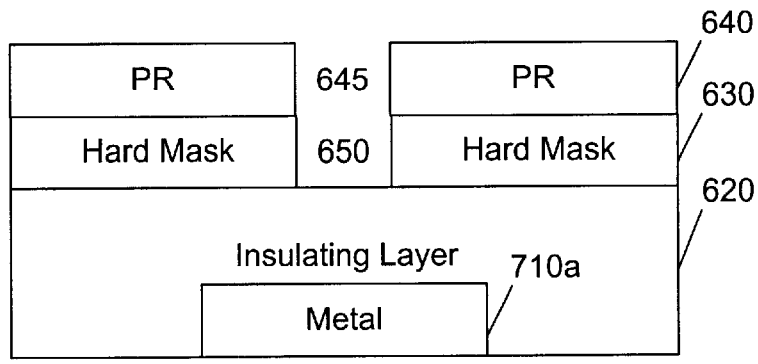
Figure 8D:
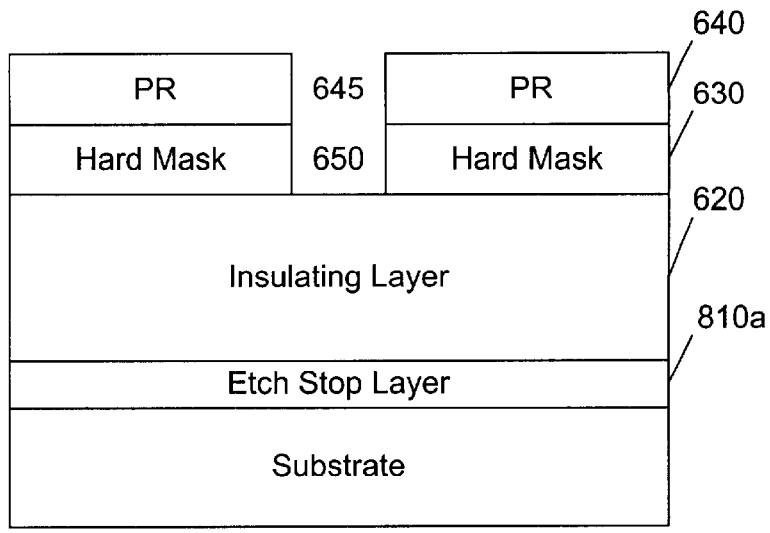

At stage 540, polysilicon or amorphous silicon hard mask layer 630 is etched using the patterning layer 640 as a mask to form one or more openings through polysilicon or amorphous silicon hard mask layer 630. Although FIGS. 6D, 7D, and 8D illustrate a single opening 650, multiple openings may be formed. Any appropriate etching technique may be used to etch polysilicon or amorphous silicon hard mask layer 630. These etching techniques are known to those of ordinary skill in the art.

Figure 6E:
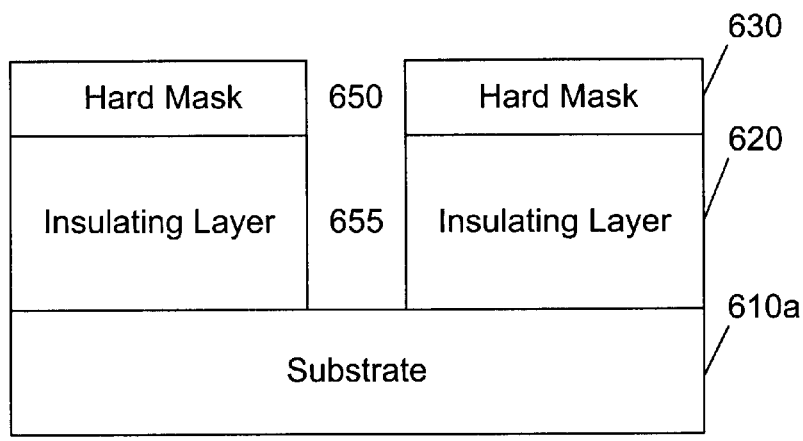
Figure 7E:
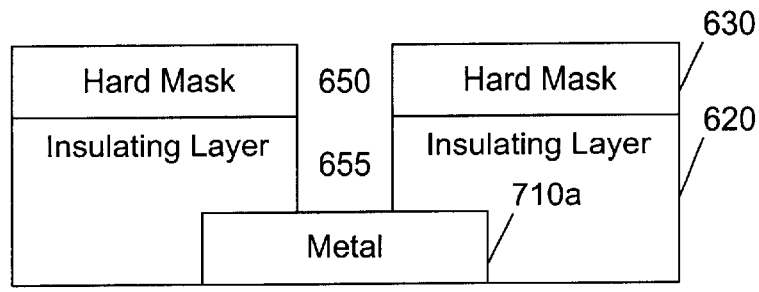
Figure 8E:
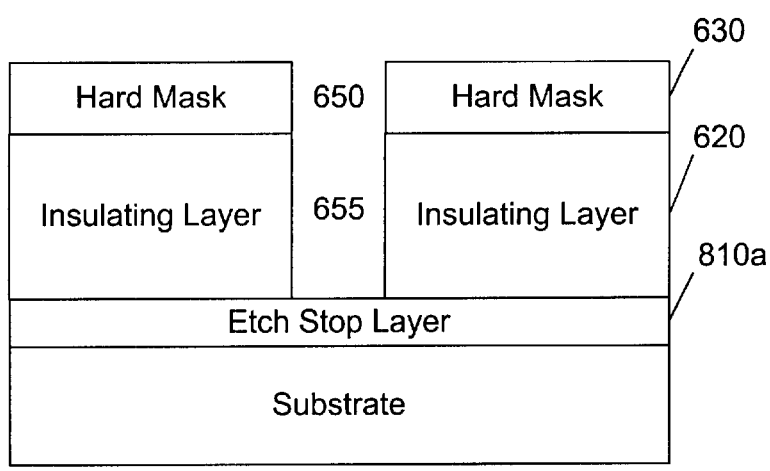

At stage 550, insulating layer 620 is etched using the etched polysilicon or amorphous silicon hard mask layer 630 as a mask to form one or more opening through insulating layer 620. Although FIGS. 6E, 7E, and 8E illustrate a single opening 655, multiple openings may be formed. Any appropriate etching technique may be used to etch insulating layer 620. These etching techniques are known to those of ordinary skill in the art.

Patterning layer 640 may be removed before or after insulating layer 620 is etched.

At stage 560, instead of attempting to remove the etched polysilicon or amorphous silicon hard mask layer 630 from the semiconductor device, layer 630 is nitridized in furnace or by plasma treatment with nitrogenous gas, such as N2 or N2O. If layer 630 is used to form an opening for a contact, such as contact 130, before metal has been deposited on the semiconductor device, a rapid thermal anneal (RTA) process, furnace treatment, or plasma treatment may be used o nitridize layer 630. But, if layer 630 is used to form an opening for a via, such as via 160, after metal has been deposited on the semiconductor device, plasma treatment with a lower process temperature is preferred.

Figure 6F:
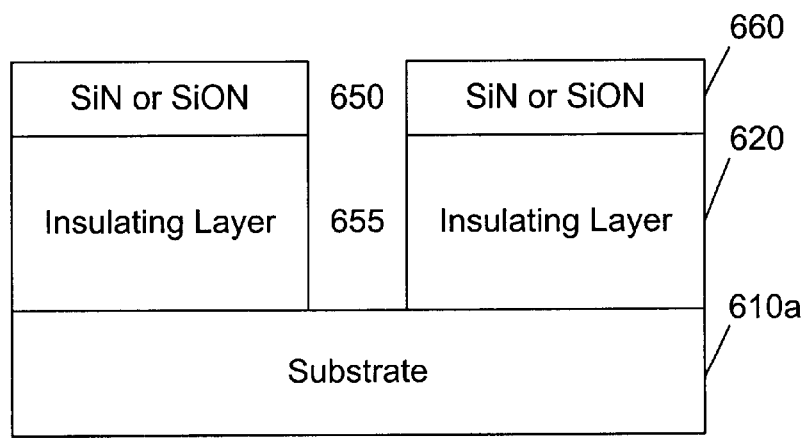
Figure 7F:
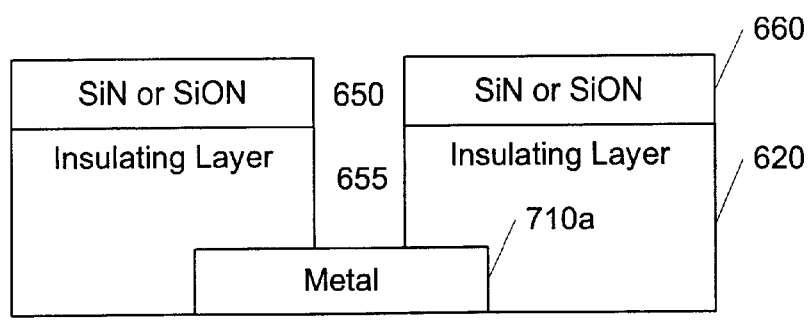
Figure 8F:
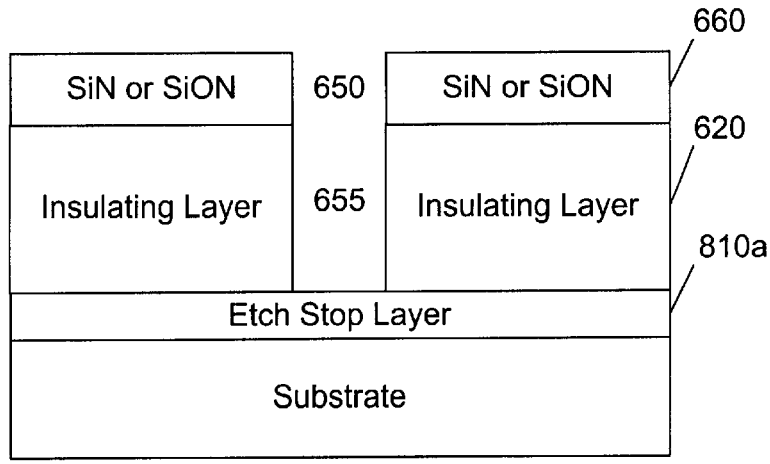

The process at stage 560 causes the etched polysilicon or amorphous silicon hard mask layer 630 to form into a silicon nitride ($Si_xN_y$) layer 660 or a silicon oxynitride ($Si_xO_yN_z$) layer 660, as shown in FIGS. 6F, 7F, and 8F. Layer 660 may remain of the semiconductor device during subsequent processing. By nitridizing etched polysilicon or amorphous silicon hard mask layer 630 to form silicon nitride ($Si_xN_y$) layer 660 or silicon oxynitride ($Si_xO_yN_z$) layer 660, the problem of forming a $TiSi_x$ layer on the semiconductor device, if the polysilicon or amorphous silicon hard mask layer 630 is not thoroughly removed, may be alleviated.

Figure 8G:
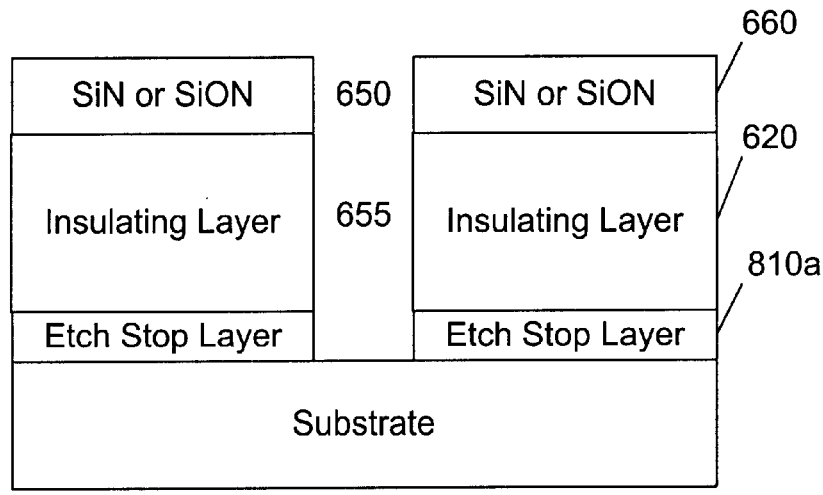

For a semiconductor device having etch stop layer 810a, etching is performed to remove the etch stop layer 810a in contact opening 655, as shown in FIG. 8G.

Thereafter, contact openings 650, 655 may be filled to form a contact 665 in any appropriate manner. For example, a barrier layer such as a titanium/titanium nitride (Ti/TiN) layer (not shown) may be deposited on layer 660, the walls of contact openings 650, 655, and the top of substrate 610a within contact opening 655. A metal layer (not shown) such as a tungsten layer is then deposited into contact openings 650, 655 and on top of layer 660. The tungsten layer and Ti/TiN layer are then removed from the top of layer 660 by CMP or an etch back process, leaving a contact 665 formed within contact openings 650, 655.

Figure 6G:
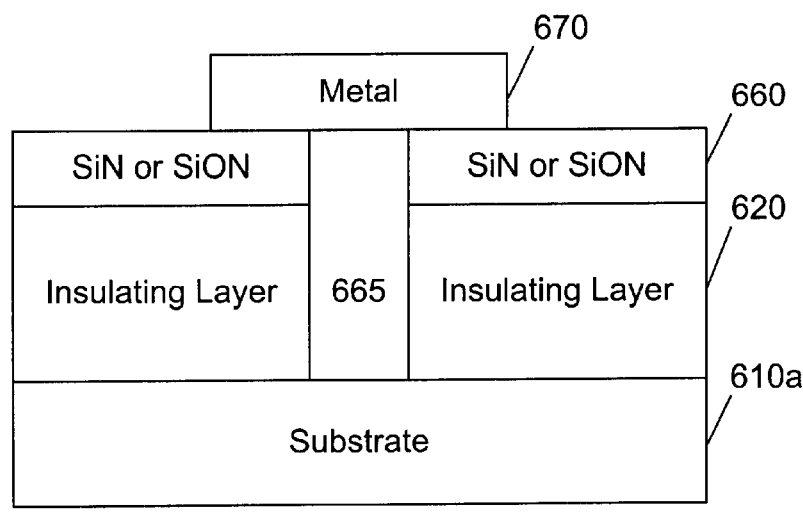
Figure 7G:
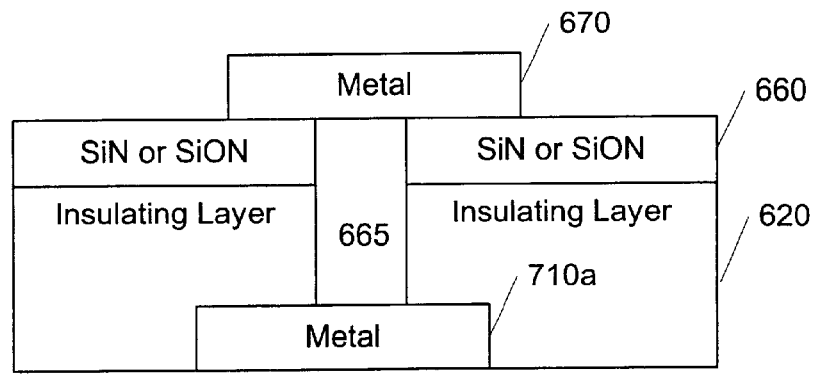
Figure 8H:
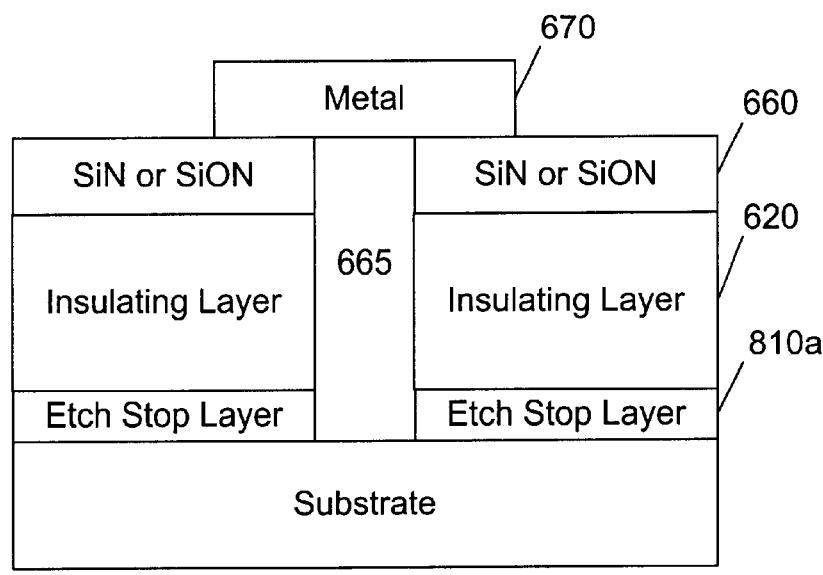

Referring to FIGS. 6G, 7G, and 8H, after the tungsten layer and Ti/TiN layer are removed, a metal line 670 is formed in any appropriate manner on contact 665.

Exemplary final semiconductor structures resulting from practice of the above-described method consistent with the present invention are illustrated in FIGS. 6G, 7G, and 8H.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming at least one opening through an insulating layer of a semiconductor device, wherein the insulating layer is between a first layer and a second layer, comprising:

forming the insulating layer on the first layer;

forming a hard mask layer as the second layer;

forming a patterning layer having at least one opening;

etching the hard mask layer using the patterning layer as a mask to form at least one opening through the hard mask layer;

etching the insulating layer using the etched hard mask layer as a mask to form the at least one opening through the insulating layer; and nitridizing the etched hard mask layer.

2. The method of claim 1, wherein the hard mask is selected from a group comprising polysilicon and amorphous silicon.

3. The method of claim 1, including providing the first layer as a substrate.

4. The method of claim 3, wherein the substrate is a semiconductor wafer.

5. The method of claim 1, including providing the first layer as a metal layer.

6. The method of claim 1, including providing the first layer as an etch stop layer.

7. The method of claim 1, including providing the insulating layer as an inter-level dielectric layer.

8. The method of claim 7, including providing the inter-level dielectric layer comprising an oxide.

9. The method of claim 1, including providing the insulating layer as an inter-metal dielectric layer.

10. The method of claim 9, including providing the inter-metal dielectric layer comprising an oxide.

11. The method of claim 1, including providing the patterning layer comprising photoresist.

12. The method of claim 1, wherein nitridizing the etched hard mask layer comprises nitridizing the etched hard mask layer with nitrogenous gas.

13. The method of claim 12, wherein nitridizing the etched hard mask layer further comprises nitridizing the etched hard mask layer by a furnace treatment.

14. The method of claim 12, wherein nitridizing the etched hard mask layer further comprises nitridizing the etched hard mask layer by rapid thermal anneal processing.

15. The method of claim 12, wherein nitridizing the etched hard mask layer further comprises nitridizing the etched hard mask layer by a plasma treatment.

16. The method of claim 1, further comprising:

forming a barrier layer on the nitridized hard mask layer, walls of the contact opening, and the top of the first layer;

forming a metal layer on the barrier layer;

removing the metal layer and the barrier layer from the top of the nitridized hard mask layer; and forming a metal line.

17. The method of claim 16, including providing the barrier layer comprising Ti/TiN.

18. The method of claim 16, including providing the metal layer comprising tungsten.

19. The method of claim 16, wherein removing the metal layer and the barrier layer comprises removing the metal layer and the barrier layer by chemical mechanical process.

20. The method of claim 16, wherein removing the metal layer and the barrier layer comprises removing the metal layer and the barrier layer by etch back.

* * * * *